(12) United States Patent
Su et al.

(10) Patent No.: US 12,317,434 B2
(45) Date of Patent: May 27, 2025

(54) TAMPER-PROOF STRUCTURE AND ELECTRONIC DEVICE

(71) Applicant: PAX COMPUTER TECHNOLOGY (SHENZHEN) CO., LTD., Guangdong (CN)

(72) Inventors: Xiaoyan Su, Guangdong (CN); Maohan Huang, Guangdong (CN); Ruizhi Tang, Guangdong (CN); Xiansheng Wu, Guangdong (CN)

(73) Assignee: PAX COMPUTER TECHNOLOGY (SHENZHEN) CO., LTD., Guangdong (CN)

( * ) Notice: Subject to any disclaimer, the term of this patent is extended or adjusted under 35 U.S.C. 154(b) by 253 days.

(21) Appl. No.: 18/318,374

(22) Filed: May 16, 2023

(65) Prior Publication Data

US 2023/0284401 A1 Sep. 7, 2023

Related U.S. Application Data

(63) Continuation-in-part of application No. PCT/CN2021/124459, filed on Oct. 18, 2021.

(30) Foreign Application Priority Data

Nov. 26, 2020 (CN) .......................... 202011355666.0

(51) Int. Cl.
*H05K 5/02* (2006.01)
*H05K 1/02* (2006.01)
(Continued)

(52) U.S. Cl.
CPC ......... *H05K 5/0208* (2013.01); *H05K 1/0275* (2013.01); *H05K 1/184* (2013.01); *H05K 5/003* (2013.01)

(58) Field of Classification Search
CPC ..... G06F 21/78; G06F 30/394; H05K 1/0275; H05K 5/0208; H05K 1/0268; H05K 1/184; H05K 5/003; H05K 2201/10151
(Continued)

(56) References Cited

U.S. PATENT DOCUMENTS

2008/0251906 A1\* 10/2008 Eaton ...................... H01L 25/16
438/109
2015/0213273 A1 7/2015 Yasukawa
(Continued)

FOREIGN PATENT DOCUMENTS

CN 101365291 A 2/2009
CN 206961266 U 2/2018
(Continued)

*Primary Examiner* — Timothy J Thompson
*Assistant Examiner* — Michael F McAllister
(74) *Attorney, Agent, or Firm* — Brooks Kushman P.C.

(57) ABSTRACT

A tamper-proof structure and an electronic device are provided in the present application. The tamper-proof structure includes a first-order circuit board, at least one tamper-proof component, at least one safety signal wire and a security chip. The safety signal wire is wrapped around an outer layer of the first-order circuit board or penetrates through a through hole and is wrapped around an inner layer of the first-order circuit board to form a tamper-proof area as required. The safety signal wire is connected to a tamper-proof switch and the security chip correspondingly, and a level of the safety signal wire is changed when the tamper-proof switch or the safety signal wire is damaged, and the security chip is triggered to erase sensitive information accordingly. By punching on the first-order circuit board, an objective of tamper-proof and an objective of reduction of design cost and simplification of security solution are achieved simultaneously.

13 Claims, 4 Drawing Sheets

(51) Int. Cl.
  *H05K 1/18*    (2006.01)
  *H05K 5/00*    (2006.01)
  *G06F 21/78*    (2013.01)
  *G06F 30/394*   (2020.01)

(58) Field of Classification Search
  USPC .......................................................... 174/50
  See application file for complete search history.

(56) References Cited

U.S. PATENT DOCUMENTS

2017/0089729 A1\* 3/2017 Brodsky .............. H05K 1/0275
2020/0264976 A1    8/2020 Hoogerbrugge et al.

FOREIGN PATENT DOCUMENTS

| CN | 107871094 A | 4/2018 |
| CN | 209710415 U | 11/2019 |
| CN | 110737923 A | 1/2020 |
| CN | 111080936 A | 4/2020 |
| CN | 210924799 U | 7/2020 |
| CN | 211653652 U | 10/2020 |
| CN | 211653795 U | 10/2020 |
| CN | 112395653 A | 2/2021 |

\* cited by examiner

TAMPER-PROOF STRUCTURE AND ELECTRONIC DEVICE

CROSS-REFERENCE TO RELATED APPLICATIONS

This application is a continuation-in-part of PCT patent application Serial No. PCT/CN2021/124459, filed on Oct. 18, 2021, which claims priority to Chinese patent application No. 202011355666.0, filed on Nov. 26, 2020. The entire contents of which are incorporated herein by reference.

FIELD

The present application relates to the technical field of electronic devices, and more particularly, to a tamper-proof structure and an electronic device.

BACKGROUND

In order to prevent leakage of sensitive information, an interior of a conventional terminal is provided with a safety area in which sensitive information cannot be obtained by a method such as damaging, detecting, grinding, drilling, chemical corrosion, etc., and an objective of protection of sensitive devices and sensitive signal wire is achieved accordingly.

Different forms of tamper-proof switches are usually used in the safety area to prevent the safety area from being opened.

A core main body forming the safety area is a printed circuit board (Printed Circuit Board, PCB), in order to enable the wiring in the PCB to meet the safety requirement, a complex blind buried hole plate design such as a second-order blind buried hole plate is generally adopted, the cost of the PCB is high due to the complex laminated design.

SUMMARY

An objective of the present application is providing a tamper-proof structure, which aims to solve a problem that the conventional second-order blind buried hole plate has a high cost.

In the first aspect of the embodiments of the present application, a tamper-proof structure is provided, the tamper-proof structure includes:
 a first-order circuit board which includes 2N wiring layers; wherein at least one first through hole is provided between a first wiring layer and a second wiring layer of the first-order circuit board, at least one second through hole is provided between the second wiring layer and a (2N−1)th wiring layer of the first-order circuit board, and at least one third through hole is provided between the (2N−1)th wiring layer and a 2Nth wiring layer of the first-order circuit board;
 a plurality of tamper-proof components arranged on an outer layer of the first-order circuit board;
 at least one safety signal wire;
 a security chip, the at least one safety signal wire is electrically connected to the plurality of tamper-proof components and the security chip, and is wrapped around the outer layer of the first-order circuit board to form a tamper-proof area, or penetrates through a corresponding through hole of the first-order circuit board and is wrapped around an inner layer of the first-order circuit board to form the tamper-proof area.

The security chip is triggered to erase sensitive information when a level of the at least one safety signal wire is changed.

In one embodiment, the security chip and the plurality of tamper-proof components are arranged on the same outer layer;
 a first terminal of each safety signal wire is connected to the security chip, a second terminal of the safety signal wire penetrates through the first wiring layer or the 2Nth wiring layer and the plurality of tamper-proof components and is connected to the security chip; the safety signal wire is further configured to form a tamper-proof area on the first wiring layer or on the 2Nth wiring layer; or alternatively,
 the first end of the safety signal wire is connected to the security chip, the second end of the safety signal wire penetrates through one said first through hole and reaches the second wiring layer, and is connected to the plurality of tamper-proof components through the second wiring layer and another said first through hole, and is further connected to the security chip through the first wiring layer; the safety signal wire is further configured to be laid and wrapped around the first wiring layer and/or the second wiring layer to form a tamper-proof area; or alternatively,
 a first terminal of the safety signal wire is connected to the security chip, a second terminal of the safety signal wire penetrates through one said third through hole and reaches a (2N−1)th wiring layer, and is connected to the plurality of tamper-proof components through the (2N−1)th wiring layer and one another said third through hole, and is further connected to the security chip through the 2Nth wiring layer; the safety signal wire is further configured to be laid and wrapped around the (2N−1)th wiring layer and/or the 2Nth wiring layer to form a tamper-proof area.

In one embodiment, the security chip and the plurality of tamper-proof components are arranged on different layers;
 a first end of the safety signal wire is connected to the security chip, a second end of the safety signal wire penetrates through one said first through hole, one said second through hole, one said third through hole and reaches another outer layer, and is connected to the plurality of tamper-proof components, and wherein the second end of the safety signal wire penetrates through another said first through hole, another said second through hole and another said third through hole and is connected to the security chip; the safety signal wire is further configured to be laid and wrapped around some wiring layers ranged from the first wiring layer to the 2Nth wiring layer.

In one embodiment, the plurality of tamper-proof components and the security chip are respectively arranged to be directly opposite to some of the at least one first through hole, the at least one second through hole and the at least one third through hole.

In one embodiment, the tamper-proof structure further includes at least one sensitive device arranged on an outer layer of the first-order circuit board. The sensitive device is directly connected to the security chip, or penetrates through a corresponding through hole of the at least one first through hole, the at least one second through hole and the at least one third through hole, and is connected to the security chip.

In one embodiment, the safety signal wire is wrapped around paths and peripheries of a connection port between the sensitive device and the security chip.

In one embodiment, the tamper-proof structure further includes a battery electrically connected to the security chip and configured to trigger the security chip to erase the sensitive information when it is powered down.

In one embodiment, a first end of the safety signal wire is connected to the battery, and a second end of the safety signal wire passes through the plurality of tamper-proof components, penetrates through at least one of the at least one first through hole, the at least one second through hole and the at least one third through hole in the first-order circuit board and/or is wrapped around at least one of the 2N wiring layers in the first-order circuit board, and then is connected to the security chip.

In one embodiment, a first end of the safety signal wire is grounded, and a second end of the safety signal wire passes through the plurality of tamper-proof components, penetrates through a corresponding through hole in the first-order circuit board and/or is wrapped around at least one of the 2N wiring layers in the first-order circuit board, and then is connected to the security chip and the battery.

In the second aspect, an electronic device is further provided in the embodiments of the present application, the electronic device includes the aforesaid tamper-proof structure.

Compared with the prior art, the embodiments of the present application have the following beneficial effects: the first-order circuit board is adopted in the tamper-proof structure, the safety signal wire is wrapped around the outer layer of the first-order circuit board or is wrapped around the inner layer of the first-order circuit board to form the tamper-proof area. The safety signal wire is connected to the tamper-proof component and the security chip, and when the tamper-proof switch or the safety signal wire is damaged, the level of the safety signal wire is changed, such that the security chip is triggered to erase the sensitive information. The objective of tamper-proof and the objective of reduction of the design cost and the simplification of the security solution are achieved simultaneously by punching on the first-order circuit board.

DESCRIPTION OF THE EMBODIMENTS

In order to make the technical problems, the technical solutions and the beneficial effects of the present application be clearer and more understandable, the present application will be further described in detail below with reference to the embodiments. It should be understood that the embodiments described herein are only intended to illustrate but not to limit the present application.

It needs to be noted that, when one component is described to be "fixed to" or "arranged on" another component, this component may be directly or indirectly arranged on another component. When it is described that one component "is connected with" another component, this component may be directly or indirectly connected to said another component.

In the description of the present application, it needs to be understood that, directions or location relationships indicated by terms such as "length", "width", "up", "down", "front", "rear", "left", "right", "vertical", "horizontal", "top", "bottom", "inside", "outside", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application.

In addition, terms such as "the first" and "the second" are only used for the purpose of illustration, and thus should not be considered as indicating or implying any relative importance, or implicitly indicating the number of indicated technical features. Thus, technical feature(s) restricted by "the first" or "the second" can explicitly or implicitly comprise one or more such technical feature(s). In the description of the present application, a term "a plurality of" has the meaning of at least two, unless otherwise there is additional explicit and specific limitation for the term of "a plurality of".

According to a first aspect of the embodiments of the present application, a tamper-proof structure 1 is provided.

Figure 1:
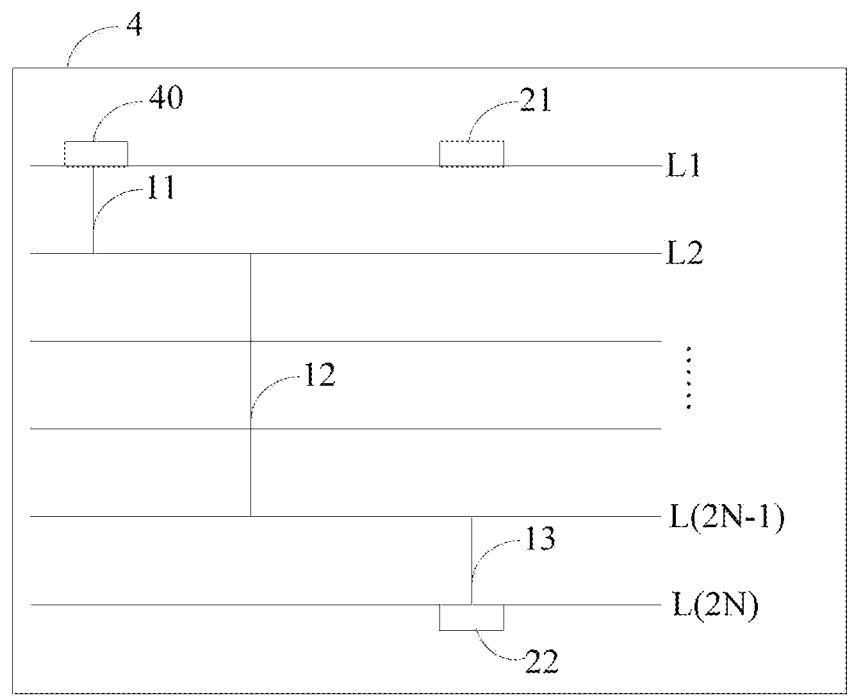
FIG. 1 illustrates a schematic structural diagram of a first-order circuit board of a tamper-proof structure provided by one embodiment of the present application.
Figure 2:
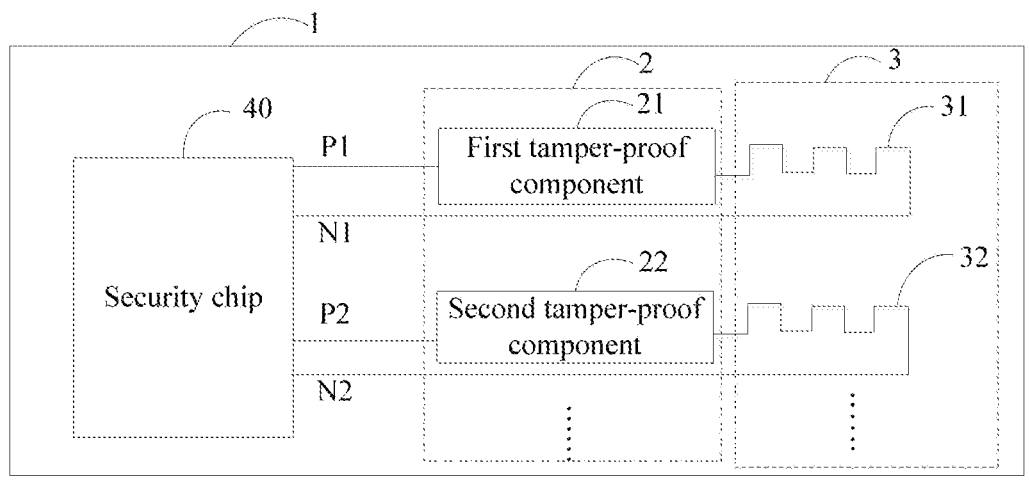
FIG. 2 illustrates a schematic diagram of a first structure of the tamper-proof structure provided by one embodiment of the present application.
Figure 3:
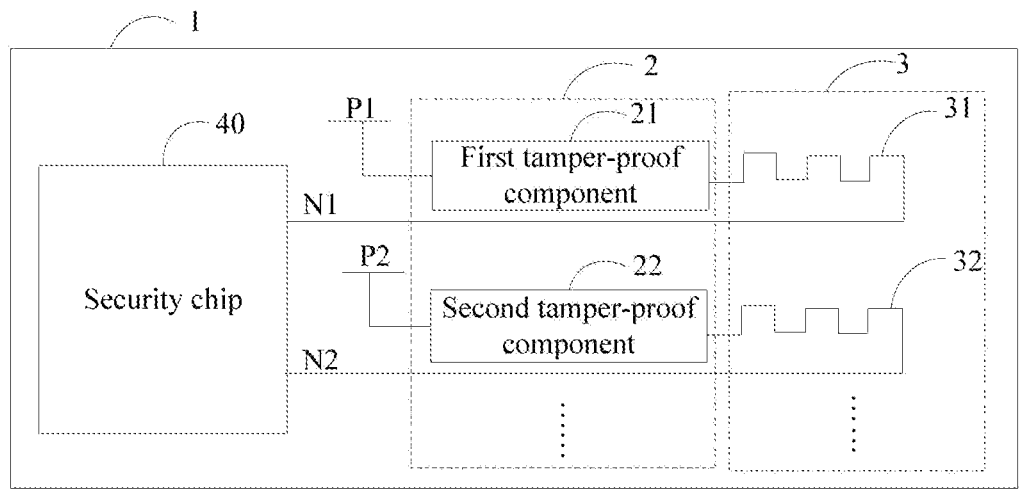
FIG. 3 illustrates a schematic diagram of a second structure of the tamper-proof structure provided by one embodiment of the present application.
Figure 4:
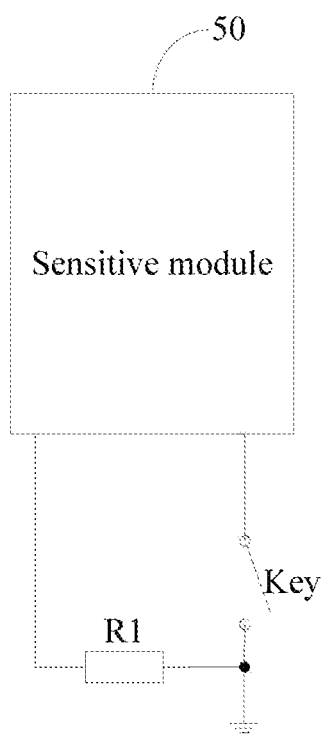
FIG. 4 illustrates a schematic diagram of a third structure of the tamper-proof structure provided by one embodiment of the present application.

In this embodiment, the tamper-proof structure 1 includes:
- a first-order circuit board 4, the first-order circuit board 4 includes 2N wiring layers. As shown in FIG. 1, at least one first through hole 11 is provided between a first wiring layer L1 and a second wiring layer L2 of the first-order circuit board 4, at least one second through hole 12 is provided between the second wiring layer L2 and the (2N−1)th wiring layer L(2N−1) of the first-order circuit board 4, and at least one third through hole 13 is provided between the (2N−1)th wiring layer L(2N−1) and the 2N-th wiring layer L(2N) of the first-order circuit board 4;
- at least one tamper-proof component, the at least one tamper-proof component is arranged on an outer layer of the first-order circuit board 4;
- at least one safety signal wire 3;
- a security chip 40, as shown in FIG. 2 and FIG. 3, at least one safety signal wire is electrically connected to the tamper-proof component and the security chip 40, and is wrapped around an outer layer of the first-order circuit board 4 to form a tamper-proof area or penetrates through a corresponding through hole of the first-order circuit board 4 and is wrapped around an inner layer of the first-order circuit board 4 to form a tamper-proof area, and the security chip 40 is triggered to erase the sensitive information when a level variation of the safety signal wire occurs.

In this embodiment, the first-order circuit board 4 is a circuit board provided with 2N layers, the circuit board is provided with copper foils for forming wiring layers for signal transmission, a punching manner of the first-order circuit board 4 is wiring layers L1-L2, wiring layers L2-L(2N−1), wiring layers L(2N−1)-L(2N). The punched hole between the wiring layers L1-L2 and the punched hole between the wiring layers L(2N−1) and L(2N) are blind holes, the inner layer is connected to the outer layer due to this arrangement. The outer layer refers to the first layer of the circuit board, the punched holes between the wiring layer L2 and the wring layer L(2N−1) are buried through holes, the inner layer is connected to the outer layer due to this arrangement, and the various wiring layers L2-L(2N−1) of the one-order circuit board are penetrated through by the at least one safety signal wire.

The security chip 40 is configured to store a plaintext key and process sensitive information such as a secret key. The tamper-proof components 2 are configured to be mechanically or electrically connected to a housing or other component of an electronic device 2. The tamper-proof components 2 may include a first tamper-proof component 21, a second tamper-proof component 22, and may be switched between a switching-on state and a switching-off state when the housing or said other component of the electronic device 2 is displaced or damaged, thereby disconnecting the safety signal wire and switching a level state received by the security chip 40, and thereby triggering the security chip 40 to trigger a protection mechanism and erase sensitive information.

Both the security chip 40 and the tamper-proof components 2 are arranged on an outer layer, that is, the first wiring layer L1 or the 2N-th wiring layer L(2N) of the first-order circuit board 4. The outer layers or the inner layers of the first-order circuit board 4 may be provided with sensitive signal wires 3 for transmitting sensitive information. The sensitive signal wires 3 are connected to the security chip 40 and a sensitive device. The sensitive device is configured to input and transmit all sensitive information, such as a password, an account, and a key. The sensitive device may be a key for inputting a password, a card reader for receiving an account, and various modules passed through by the sensitive signal wires 3. The sensitive device may be arranged on the first-order circuit board 4 or be arranged in the electronic device, the arrangement of the sensitive device is not limited thereto. Moreover, the safety signal wires 3 are shown in FIG. 3, a first safety signal wire 31, a second safety signal wire 32, etc. are electrically connected to the security chip 40 and the tamper-proof component. A connection wire between the safety signal wires 3 is arranged accordingly in accordance with the position of the security chip 40 and the position of the sensitive signal wire for connecting the security chip 40 with an external communication device. The safety signal wires 3 may be wrapped around the outer layer and are connected to the security chip 40 and the tamper-proof component, thereby forming a tamper-proof area for tamper-proof of the security chip 40 or sensitive signal wire in the inner layer. As an alternative, the safety signal wires 3 may be led out from the security chip 40, and penetrates through the corresponding through hole of the first through hole 11, the second through hole 12 and the third through hole 13 and reaches a corresponding position of the tamper-proof component, and then penetrates through the corresponding through hole and is connected to the tamper-proof component, and then is wrapped around the corresponding inner layer, thereby forming a tamper-proof area. When the safety signal wires 3 or the tamper-proof components 2 are damaged, a signal level of the signal transmitted to the security chip 40 through the safety signal wires 3 is changed, and the security chip 40 triggers the protection mechanism and erases the sensitive information.

Moreover, as shown in FIG. 2 and FIG. 3, the connection manner between the safety signal wire and the security chip 40 and the tamper-proof component may be correspondingly arranged, that is, a dynamic arrangement and a static arrangement may be adopted. As shown in FIG. 2, in one embodiment, the dynamically arranged safety signal wires 3 pass through the tamper-proof components 2 and a corresponding through hole and/or a wiring layer of the first-order circuit board 4, is wrapped and is connected to the security chip 40. A level signal sent from an output terminal of the security chip 40 is fed back to an input terminal through the tamper-proof component, an intermediate connection wire of the safety signal wires 3 are wrapped around the outer layer or penetrates through the through hole and is wrapped around the inner layer and form a tamper-proof area. The level signal of the input terminal needs to be consistent with the level signal of the output terminal. If the level signal of the input terminal needs to be consistent with the level signal of the output terminal, the security chip 40 will be triggered.

As shown in FIG. 3, one end of a statically arranged safety signal wire is connected to another signal wire or a signal terminal of the tamper-proof component, and the other end of the statically arranged safety signal wire is connected to the security chip 40, an intermediate connection line of the safety signal wire is wrapped around the outer layer or penetrates through the through hole and is wrapped around the inner layer and form a tamper-proof area. The security chip 40 determines the received level signal according to the pre-stored level. When the winding or the tamper-proof component on the circuit board is attacked and disconnected or short circuited, and switching or loss of the level signal is caused, the security chip 40 triggers a protection mechanism.

The first-order circuit board 4 may be provided with different tamper-proof components 2 on the outer layer, that is, the safety signal wires 3 may be connected to the tamper-proof components 2 one by one, or a plurality of tamper-proof components 2 are connected to the wirings of one single safety signal wire, and the specific connection manner of the safety signal wire may be correspondingly arranged according to the security requirement.

One end of the safety signal wire may be connected to a high level or a low level. Correspondingly, the signal terminal of the security chip 40 may be configured as a high level or a low level, and the type of the level signal and the connection manner of the tamper-proof component may be arranged correspondingly.

The number of layers of the first-order circuit board 4 is not limited. The first-order circuit board 4 may be a board having 6 layers, a board having 8 layers, or the like.

The tamper-proof components 2 may be tamper-proof switches or other components having protection capability, such as printed circuit boards (Printed Circuit Boards, PCBs) or flexible printed circuits (Flexible Printed Circuits, FPCs) with safety signal wire, a chip having a tamper-proof function, and the tamper-proof switch may be a dome sheet, a pad, or the like.

The safety signal wires 3 are connected to the tamper-proof components 2 and the security chip 40 according to the position of the tamper-proof component and the security chip 40.

The first-order circuit board 4 is used in the tamper-proof structure 1, each safety signal wire is wrapped around the outer layer of the first-order circuit board 4 according to the requirement or passes through a through hole and is wrapped around the inner layer of the first-order circuit board, thereby forming the tamper-proof area. The safety signal wires 3 are correspondingly connected to the tamper-proof switch and the security chip 40, and when the tamper-proof switch or the safety signal wires 3 are damaged, the levels of the safety signal wires 3 are changed, and the security chip 40 is triggered to erase sensitive information, By using a punching method for the first-order circuit board 4, the objective of tamper-proof is achieved, the design cost is reduced and security solution is simplified.

In one embodiment, the security chip 40 and the tamper-proof component are arranged on the same outer layer.

A first end of the safety signal wire is connected to the security chip 40, a second end of the safety signal wire is connected to the security chip 40 through the first wiring layer L1 or the 2Nth wiring layer L(2N) and some tamper-proof components 2. The safety signal wire is wrapped around the first wiring layer L1 or the 2Nth wiring layer L(2N) to form a tamper-proof area.

As an alternative, the first end of the safety signal wire is connected to the security chip 40, the second end of the safety signal wire penetrates through a first through hole 11 and reaches the second wiring layer L2, and connects to some tamper-proof components 2 through the second wiring layer L2 and another first through hole 11, and connects to the security chip 40 through the first wiring layer L1. The safety signal wire is further configured to be laid and wrapped around the first wiring layer L1 and/or the second wiring layer L2 to form a tamper-proof area.

As an alternative, the first end of the safety signal wire is connected to the security chip 40, the second end of the safety signal wire penetrates through a third through hole 13 and reaches the (2N−1)th wiring layer L(2N−1), and connects to several tamper-proof components 2 through the (2N−1)th wiring layer L(2N−1) and another third through hole 13, and connects to the security chip 40 through the 2N wiring layer L(2N). The safety signal wire is further configured to be laid and wrapped around the (2N−1)th wiring layer L(2N−1) and/or the 2Nth wiring layer L(2N) to form a tamper-proof area.

In this embodiment, as shown in FIG. 1, the tamper-proof component is the first tamper-proof component 21, when the security chip 40 and the first tamper-proof component 21 are arranged on the first wiring layer, two first through hole 11 are drilled at the corresponding positions of the security chip 40 and the first tamper-proof component 21. Two connection methods are applicable for the security chip 40 and the first tamper-proof component 21, one method is directly connecting the security chip 40 and the first tamper-proof component 21 with the first wiring layer L1 through the safety signal wire. As an alternative, the safety signal wire is led out from the signal terminal of the security chip 40 and penetrates through the first through hole 11 and reaches the second wiring layer L2. In this embodiment, the safety signal wire may also penetrate through the second through hole 12 and the third through hole 13 and is connected to the second wiring layer L2 again. In order to reduce the difficulty and the cost of wiring, in this embodiment, the safety signal wire is connected to the first tamper-proof component 21 through another first through hole 11 at the corresponding position of the first tamper-proof component 21. Similarly, the safety signal wire may also be connected to the second wiring L2 again through the first through hole 11. In order to reduce the difficulty and the cost of wiring, in this embodiment, the safety signal wire is connected to another signal terminal of the security chip 40 through the first wiring layer L1.

Similarly, when the security chip 40 and the first tamper-proof component 21 are arranged on the 2Nth wiring layer L(2N), two third through holes 13 are drilled at the corresponding positions of the security chip 40 and the first tamper-proof component 21. Two connection methods are applicable for the security chip 40 and the first tamper-proof component 21. One method is directly connecting the security chip 40 and the first tamper-proof component 21 with the 2Nth wiring layer L(2N) through the security signal wire. As an alternative, one security signal wire is led out from the signal terminal of the security chip 40 and penetrates through the third through hole 13 to reach the (2N−1)th wiring layer L(2N−1). In this embodiment, the safety signal wire may also be connected to the 2N−1 wiring layer L (2N−1) again through the second through hole 12 and the first through hole 11. In order to reduce the difficulty and the cost of wiring, in this embodiment, the safety signal wire is connected to the first tamper-proof component 21 through another third through hole 13 at the corresponding position of the first tamper-proof component 21. Similarly, in this embodiment, the safety signal wire may also be connected to the (2N−1)th wiring layer L(2N−1) again through the third through hole 13. In order to reduce the difficulty and the cost of wiring, the safety signal wire is connected to another signal terminal of the security chip 40 through the 2Nth wiring layer L(2N).

Furthermore, according to different security restrictions, the safety signal wire is further configured to be laid and wrapped around the corresponding wiring layer to form a tamper-proof area, thereby triggering the security chip 40 to erase sensitive information when the wiring layer is damaged.

In one embodiment, the security chip 40 and the tamper-proof component are arranged on different layers.

The first end of the safety signal wire is connected to the security chip 40, and the second end of the safety signal wire reaches the other outer layer through a first through hole 11, a second through hole 12, and a third through hole 13, and is connected to several tamper-proof components 2. The security chip 40 is also connected through another first through hole 11, another second through hole 12, and another third through hole 13, The safety signal wire is further laid and wrapped around several wiring layers from the first wiring layer L1 to the 2Nth wiring layer L (2N) to form a tamper-proof area.

In this embodiment, as shown in FIG. 1, when the tamper-proof component is the second tamper-proof component 22, the security chip 40 is arranged at the first wiring layer L1, and the second tamper-proof component 22 is arranged at the 2Nth wiring layer L(2N), the safety signal wire 32 is first connected to the security chip 40 and is connected to the second tamper-proof component 22 through the first through hole 11, the second through hole 12, and the third through hole 13. Furthermore, the safety signal wire 22 is connected to the security chip 40 again through the third through hole 13, the second through hole 12, and the first through hole 11, thereby forming a series connection protection circuit. Furthermore, safety signal wires 3 are laid and wrapped around the corresponding wiring layers to form a tamper-proof area according to different safety restrictions.

Similarly, when the second tamper-proof component 22 is arranged at the first wiring layer L1 and the security chip 40 is arranged at the 2N wiring layer L(2N), the safety signal wire 32 is firstly connected to the security chip 40 and is connected to the second tamper-proof component 22 through the third through hole 13, the second through hole 12, and the first through hole 11. Furthermore, the safety signal wire 32 is connected to the security chip 40 again through the first through hole 11, the second through hole 12, and the third through hole 13, thereby forming a series connection protection circuit.

As shown in FIG. 1, in one embodiment, the tamper-proof component and the security chip 40 are respectively arranged to be opposite to some of the at least one first through hole 11, at least one second through hole 12, and at least one third through hole 13.

In this embodiment, the tamper-proof component and the security chip 40 are connected to the outer layer of the first-order circuit board through a bonding pad, and holes are drilled at opposite positions, in order that the safety signal wire is connected to the tamper-proof component and the security chip 40 through the corresponding through holes in the middle of the wiring layers L1-L(2N−1), the exposure of the through holes is avoided, and the security of tamper-proof is improved.

Figure 5:
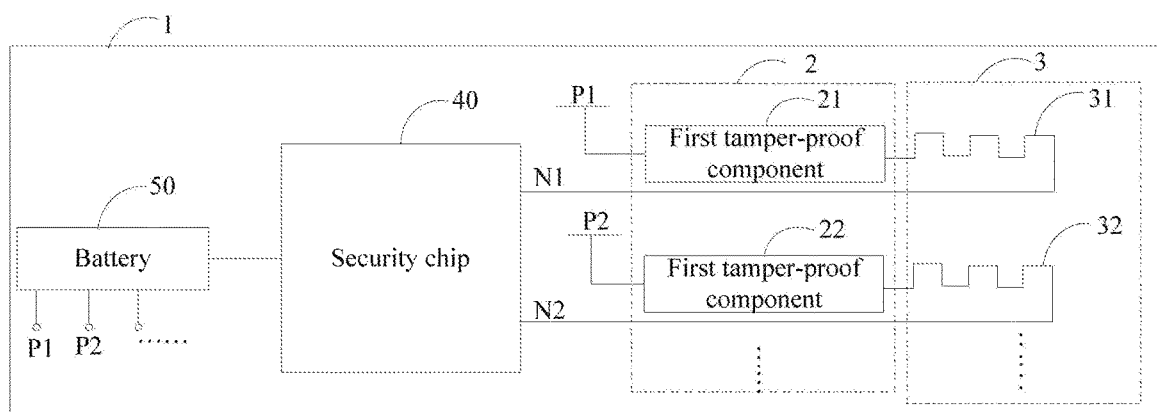
FIG. 5 illustrates a schematic diagram of a fourth structure of the tamper-proof structure provided by one embodiment of the present application.

As shown in FIG. 5, in one embodiment, the tamper-proof structure 1 further includes at least one sensitive device Key, the at least one sensitive device Key is located on the outer layer of the first-order circuit board 4. The sensitive device Key is directly connected to the security chip 40, or is connected to the security chip 40 through the at least one first through hole 11, the at least one second through hole 12, and the at least one third through hole 13.

In this embodiment, the tamper-proof structure 1 is further provided with the sensitive device Key for operation. The wiring of the sensitive device Key is the same as the wiring of the safety signal wire. The sensitive signal wire located at the outer layer is directly connected to the security chip 40. The sensitive signal wire located at the inner layer may penetrate through the corresponding through hole(s) and is connected to the security chip 40. The sensitive signal wire may also pass through the corresponding associated devices, such as a resistor R1, a capacitor, etc.

Moreover, the safety signal wires 3 are wrapped around the paths and the peripheries of the connection port between the sensitive device Key and the security chip 40. At least one layer of safety signal wire is arranged at the corresponding position of the sensitive signal wire to realize a coverage protection and prevent sensitive information on the sensitive signal wire from being filched. The sensitive device Key is connected to the security chip 40 through the sensitive signal wire to achieve input, transmission, and storage of the sensitive signal.

Furthermore, in order to improve the safety of the tamper-proof structure 1, the safety signal wire may also be selectively covered on the through hole(s) between the sensitive device Key and the security chip 40. That is, when the sensitive device Key needs to be connected to the security chip 40 through the through hole, all through holes penetrated through need to be covered by the safety signal wire. The safety signal wire is wrapped above or below the corresponding through hole to form a tamper-proof area.

As shown in FIG. 5, in one embodiment, the tamper-proof structure 1 further includes a battery 50 electrically connected to the security chip 40. The battery 40 triggers the security chip 40 to erase sensitive information when the battery 40 is power down.

In this embodiment, the battery 50 is used to provide power for the security chip 40 to ensure that the security chip 40 is powered by the battery 50 independently. The security chip 40 may realize storage of the sensitive information storage and monitoring of the security signal wire regardless of whether the main power supply of the electronic device is powered on. Types of batteries are not limited. In one embodiment, the battery 50 is a button cell arranged at the outer layer of the first-order circuit board 4.

Referring to FIG. 5 again, in one embodiment, the first end of each of the safety signal wires 3 is connected to the battery 50, and the second end of each of the safety signal wires 3 penetrate through the tamper-proof components 2, the corresponding through hole(s) and/or is wrapped around the wiring layer(s) in the first-order circuit board 4, and is connected to the security chip 40.

In this embodiment, the battery 50 provides a high-level signal for the safety signal wire to achieve static arrangement of the safety signal wire. The security chip 40 detects the state of the level signal at the input terminal and triggers a protection mechanism when the level signal is changed.

Figure 6:
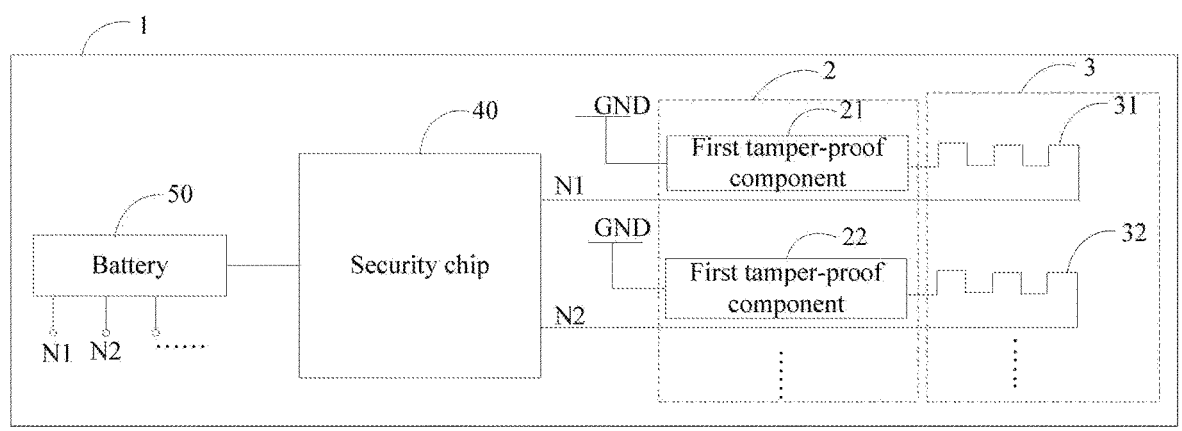
FIG. 6 illustrates a schematic diagram of a fifth structure of the tamper-proof structure provided by one embodiment of the present application.

As shown in FIG. 6, in one embodiment, the first end of each of the safety signal wires 3 is grounded, the second end of each of the safety signal wires 3 penetrates through the tamper-proof component, the corresponding through hole(s) and/or is wrapped around the wiring layer(s) in the first-order circuit board 4, and is connected to the security chip 40 and battery 50.

In this embodiment, a ground electrode provides a low-level signal for the safety signal wire to achieve static arrangement of the safety signal wires 3. The security chip 40 detects the state of the level signal of the input terminal, and triggers a protection mechanism when the level signal is changed.

A circuit board having six layers is taken as an example, the first through hole 11, the second through hole 12, and the third through hole 13 are formed according to the connection requirement.

Assuming that the sensitive information only contains passwords, all devices are arranged on the first wiring layer L1, four tamper-proof switches SW1-SW4 are provided on the front surface of the first-order circuit board, and two tamper-proof switches SW5-SW6 are arranged on the rear surface of the first-order circuit board 4.

The security chip 40 has four dynamic security signal wires, that is, P1-N1, P2-N2, P3-N3, and P4-N4, respectively.

There are multiple restrictions on the arrangement of the tamper-proof structure 1:

The first limitation requirement: passwords need to be protected by the first layer L1, and the security signal wire can only be routed in the first wiring layer L1 and the second wiring layer L2.

The second limitation requirement: the safety signal wire can only be wrapped around the wiring layers L3-L5, and P3 and P4 must be intertwined.

The third limitation requirement: the front tamper-proof switch and the rear tamper-proof switch cannot use the same pair of TAMPER signals.

The fourth limitation requirement: the dynamic safety signal wires P1-N1, P2-N2 can only be routed in the first wiring layer L1 and the second wiring layer L2.

The fifth limitation requirement: the wiring of the safety signal wire must cover all security signals and passwords in the first wiring layer L1 and the second wiring layer L2.

The sixth restriction requirement: holes 2-5 for the data of the safety signal wire can only be punched at the lower side of the rear tamper-proof switch.

Examples of the optional design solutions of the tamper-proof structure 1 are described below:

1) input terminal P1: the safety signal wire is led out from the security chip 40, connects to the front tamper-proof switch SW1 through the wiring layer L1, and then connects to the front tamper-proof switch SW2, and finally connects to the terminal N1 of the security chip 40 through the first wiring layer L1;
2) input terminal P2: the safety signal wire is led out from the security chip 40, penetrates through the first through hole 11, the wiring layer L2 and is wrapped below the front tamper-proof switch SW3, and then penetrates through another first through hole 11, is connected to the front tamper-proof switch SW3, and then is connected to the front tamper-proof switch SW4, and finally directly connects to the terminal N2 of the security chip 40 again through the first wiring layer L1.
3) wiring of the sensitive signal: the sensitive signal wire is led out from the security chip 40, penetrates through the first through hole 11, the second wiring layer L2 and is routed to the sensitive device Key, and then penetrates through another first through hole 11. Similarly, the sensitive signal wire is routed to the associated bonding pad or device through the wring layers L1/L2, and finally connects to the security chip 40 again.
4) input terminal P3: the safety signal wire is led out from the security chip 40, penetrates through the first through hole 11, the wiring layer L2 and reaches the bottom of the rear tamper-proof switch SW5, penetrates through the second through hole 12, and is wrapped with input terminal P4 at the third wiring layer L3. The range of wrapping is in accordance with the fifth limitation requirement. After wrapping, the safety signal wire is connected to the bottom of the rear tamper-proof switch SW5 again, penetrates through the third through-hole 13, and connects to the rear tamper-proof switch SW5. Then, a through hole is punched or the safety signal wire penetrates through the second through hole 12 and the third through hole 13, and is wrapped around the second wiring layer L2, and is routed to the bottom of the security chip 40, penetrates through the first through hole 11, and connects to the output terminal N3 of the security chip 40.
5) input terminal P4: the safety signal wire is let out from the security chip 40, penetrates through the first through hole 11, the wiring layer L2 and is routed to the bottom of the rear tamper-proof switch SW6, penetrates through the second through hole 12, and is wrapped with the input terminal P3 on the L3 layer. The range of wrapping is in accordance with the fifth limitation requirement. After wrapping, the safety signal wire is connected to the bottom of the rear tamper-proof switch SW6 again, penetrates through the third through hole 13, and connects to the rear tamper-proof switch SW6. Then, a through hole is punched or the safety signal wire penetrates through the second through hole 12, the third through hole 13, and is wrapped around the second wiring layer L2 and connects to the bottom of the security chip 40, and penetrates through the first through hole 11, and connects to the output terminal N4 of the security chip 40.

The number of first through holes 11, second through holes 12, and the third through holes 13 may be correspondingly arranged, and one security chip 40 may be arranged to be opposite to one first through hole 11 or multiple first through holes 11.

By using the punching method for the first-order circuit board 4, the objective of tamper-proof is achieved, and the design cost is reduced and the security solution is simplified simultaneously.

Figure 7:
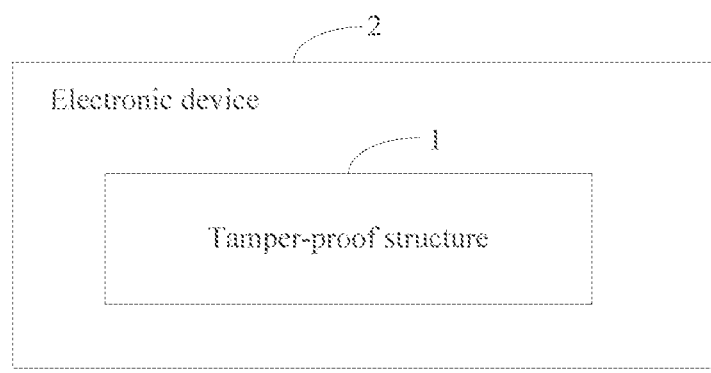
FIG. 7 illustrates a schematic structural block diagram of an electronic device provided by one embodiment of the present application.

An electronic device 2 is further provided in the present application. As shown in FIG. 7, the electronic device 2 includes a tamper-proof structure 1. Regarding the specific structure of the tamper-proof structure 1, reference can be made to the embodiments described above. Since the electronic device 2 adopts all technical solutions of the aforesaid embodiments, thus, the electronic device 2 has at least all beneficial effects that can be achieved by the technical solutions of the aforesaid embodiments, the beneficial effects of the electronic device 2 are not repeatedly described herein.

The foregoing embodiments are only intended to explain the technical solutions of the present application, rather than limiting the technical solutions of the present application. Although the present application has been described in detail with reference to these embodiments, a person of ordinary skilled in the art should understand that, the technical solutions disclosed in the embodiments may also be amended, some technical features in the technical solutions may also be equivalently replaced. The amendments or the equivalent replacements don't cause the essence of the corresponding technical solutions to be deviated from the spirit and the scope of the technical solutions in the embodiments of the present application, and thus should all be included in the protection scope of the present application.

What is claimed is:

1. A tamper-proof structure, comprising:
   a first-order circuit board which comprises 2N wiring layers;
   at least one first through hole provided between a first wiring layer and a second wiring layer of the first-order circuit board;
   at least one second through hole provided between the second wiring layer and a (2N−1)th wiring layer of the first-order circuit board;
   at least one third through hole provided between the (2N−1)th wiring layer and a 2Nth wiring layer of the first-order circuit board;
   a plurality of tamper-proof components arranged on an outer layer of the first-order circuit board;
   at least one safety signal wire; and
   a security chip, wherein the at least one safety signal wire is electrically connected to the plurality of tamper-proof components and the security chip, and is wrapped around the outer layer of the first-order circuit board to form a tamper-proof area, or penetrates through a corresponding through hole of the first-order circuit board and is wrapped around an inner layer of the first-order circuit board to form the tamper-proof area; and wherein the security chip is triggered to erase sensitive information when a level of the at least one safety signal wire is changed.

2. The tamper-proof structure according to claim 1, wherein the security chip and the plurality of tamper-proof components are arranged on the same outer layer;
   a first terminal of each safety signal wire is connected to the security chip, a second terminal of the safety signal wire penetrates through the first wiring layer or the 2Nth wiring layer and the plurality of tamper-proof components and is connected to the security chip; and the safety signal wire is further configured to form a tamper-proof area on the first wiring layer or on the 2Nth wiring layer.

3. The tamper-proof structure according to claim 1, wherein the security chip and the plurality of tamper-proof components are arranged on different layers;
   a first end of the safety signal wire is connected to the security chip, a second end of the safety signal wire penetrates through one said first through hole, one said second through hole, one said third through hole and reaches another outer layer, and is connected to the plurality of tamper-proof components, and wherein the second end of the safety signal wire penetrates through another said first through hole, another said second through hole and another said third through hole and is connected to the security chip; the safety signal wire is further configured to be laid and wrapped around some wiring layers ranged from the first wiring layer to the 2Nth wiring layer.

4. The tamper-proof structure according to claim 1, wherein the plurality of tamper-proof components and the security chip are respectively arranged to be directly opposite to some of the at least one first through hole, the at least one second through hole and the at least one third through hole.

5. The tamper-proof structure according to claim 1, further comprising at least one sensitive device arranged on an outer layer of the first-order circuit board, wherein the sensitive device is directly connected to the security chip.

6. The tamper-proof structure according to claim 5, wherein the safety signal wire is wrapped around paths and peripheries of a connection port between the sensitive device and the security chip.

7. The tamper-proof structure according to claim 1, further comprising a battery electrically connected to the security chip and configured to trigger the security chip to erase the sensitive information when it is powered down.

8. The tamper-proof structure according to claim 7, wherein a first end of the safety signal wire is connected to the battery, and a second end of the safety signal wire passes through the plurality of tamper-proof components, penetrates through the at least one first through hole, or the at least one second through hole or the at least one third through hole in the first-order circuit board and/or is wrapped around a wiring layer in the first-order circuit board, and then is connected to the security chip.

9. The tamper-proof structure according to claim 7, wherein a first end of the safety signal wire is grounded, and a second end of the safety signal wire passes through the plurality of tamper-proof components, penetrates through a corresponding through hole in the first-order circuit board and/or is wrapped around at least one of the 2N wiring layers in the first-order circuit board, and then is connected to the security chip and the battery.

10. An electronic device, comprising
   a tamper-proof structure, the tamper-proof structure further comprising:
   a first-order circuit board which comprises 2N wiring layers; wherein at least one first through hole is provided between a first wiring layer and a second wiring layer of the first-order circuit board, at least one second through hole is provided between the second wiring layer and a (2N−1)th wiring layer of the first-order circuit board, and at least one third through hole is provided between the (2N−1)th wiring layer and a 2Nth wiring layer of the first-order circuit board;
   a plurality of tamper-proof components arranged on an outer layer of the first-order circuit board;
   at least one safety signal wire;
   a security chip, wherein the at least one safety signal wire is electrically connected to the plurality of tamper-proof components and the security chip, and is wrapped around the outer layer of the first-order circuit board to form a tamper-proof area, or penetrates through a corresponding through hole of the first-order circuit board and is wrapped around an inner layer of the first-order circuit board to form the tamper-proof area; and wherein the security chip is triggered to erase sensitive information when a level of the at least one safety signal wire is changed.

11. The tamper-proof structure according to claim 1, wherein the security chip and the plurality of tamper-proof components are arranged on the same outer layer;
   the first end of the safety signal wire is connected to the security chip, the second end of the safety signal wire penetrates through one said first through hole and reaches the second wiring layer, and is connected to the plurality of tamper-proof components through the second wiring layer and another said first through hole, and is further connected to the security chip through the first wiring layer; the safety signal wire is further configured to be laid and wrapped around the first wiring layer and/or the second wiring layer to form a tamper-proof area.

12. The tamper-proof structure according to claim 1, wherein the security chip and the plurality of tamper-proof components are arranged on the same outer layer;
   a first terminal of the safety signal wire is connected to the security chip, a second terminal of the safety signal wire penetrates through one said third through hole and reaches a (2N−1)th wiring layer, and is connected to the plurality of tamper-proof components through the (2N−1)th wiring layer and one another said third through hole, and is further connected to the security chip through the 2Nth wiring layer; the safety signal wire is further configured to be laid and wrapped around the (2N−1)th wiring layer and/or the 2Nth wiring layer to form a tamper-proof area.

13. The tamper-proof structure according to claim 1, wherein the tamper-proof structure further comprises at least one sensitive device arranged on an outer layer of the first-order circuit board, the sensitive device penetrates through one of the at least one first through hole, the at least one second through hole and the at least one third through hole, and then is connected to the security chip.

* * * * *